US008710609B2

(12) United States Patent
Zitzlsperger et al.

(10) Patent No.: US 8,710,609 B2
(45) Date of Patent: Apr. 29, 2014

(54) SEMICONDUCTOR ARRANGEMENT WITH A SOLDER RESIST LAYER

(75) Inventors: Michael Zitzlsperger, Regensburg (DE); Matthias Sperl, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/127,623

(22) PCT Filed: Jan. 29, 2010

(86) PCT No.: PCT/EP2010/051116
§ 371 (c)(1),
(2), (4) Date: Jul. 21, 2011

(87) PCT Pub. No.: WO2010/091967
PCT Pub. Date: Aug. 19, 2010

(65) Prior Publication Data
US 2011/0303945 A1    Dec. 15, 2011

(30) Foreign Application Priority Data
Feb. 12, 2009  (DE) .................. 10 2009 008 738

(51) Int. Cl.
*H01L 31/0203*  (2014.01)
*H01L 21/56*  (2006.01)
(52) U.S. Cl.
CPC ....................................... *H01L 21/56* (2013.01)
USPC ............ 257/433; 257/E21.502; 257/E31.117; 257/E33.066
(58) Field of Classification Search
CPC ....................................................... H01L 21/56

USPC ............ 257/E33.066, 433, E21.502, E31.117
See application file for complete search history.

(56) References Cited

U.S. PATENT DOCUMENTS

| 5,973,337 | A * | 10/1999 | Knapp et al. ..................... 257/99 |
|---|---|---|---|
| 6,649,832 | B1 | 11/2003 | Brophy et al. |
| 7,026,192 | B2 * | 4/2006 | Minamio et al. .............. 438/123 |
| 7,109,067 | B2 | 9/2006 | Kobayashi |
| 2001/0046141 | A1 | 11/2001 | Walker et al. |
| 2002/0093026 | A1 * | 7/2002 | Huang ............................ 257/98 |
| 2007/0034784 | A1 * | 2/2007 | Tsai ............................... 250/226 |
| 2007/0063209 | A1 * | 3/2007 | Sugiura et al. .................. 257/98 |
| 2008/0128736 | A1 | 6/2008 | Han et al. |
| 2008/0231169 | A1 | 9/2008 | Hata et al. |

FOREIGN PATENT DOCUMENTS

| EP | 0684641 | 11/1995 |
|---|---|---|
| EP | 1 059 678 | 12/2000 |
| EP | 1153792 | 11/2001 |

(Continued)

*Primary Examiner* — Kim Nguyen
*Assistant Examiner* — Alexander Belousov
(74) *Attorney, Agent, or Firm* — DLA Piper LLP (US)

(57) ABSTRACT

A semiconductor arrangement including at least one lead arrangement with a top and a bottom opposite the top; at least one solder resist layer which partially covers the top and the bottom, at least sub-zones of the top and the bottom, which are not covered by the solder resist layer, forming electrical base members; an optoelectronic semiconductor element, which is mounted on at least one of the base members on the top of the lead arrangement and is connected electrically conductively therewith, and an encapsulant applied at least to the top of the lead arrangement, the encapsulant covering up the semiconductor element and lying at least partially against the solder resist layer, wherein the base members are bordered all round by the solder resist layer.

13 Claims, 4 Drawing Sheets

(56) References Cited

FOREIGN PATENT DOCUMENTS

| | | |
|---|---|---|
| EP | 1357595 | 10/2003 |
| EP | 1 978 566 | 10/2008 |
| JP | 9-064225 | 3/1997 |
| JP | 2001-094026 | 6/2001 |
| JP | 2003-110058 | 4/2003 |
| JP | 2007-235085 | 9/2007 |
| JP | 2007-324205 | 12/2007 |
| JP | 2008-140646 | 6/2008 |
| JP | 2008-282917 | 11/2008 |
| TW | 389972 B | 5/2000 |
| TW | 2006-29596 B | 8/2009 |
| WO | 03/034508 | 4/2003 |
| WO | 2005/039260 | 4/2005 |

* cited by examiner

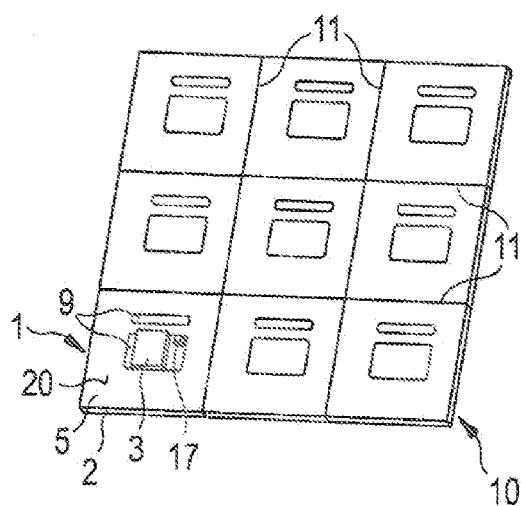
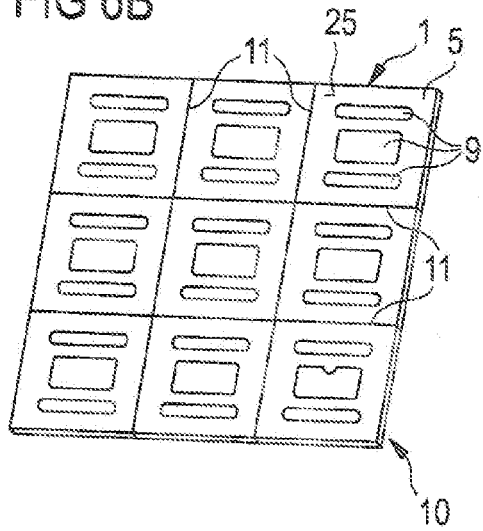
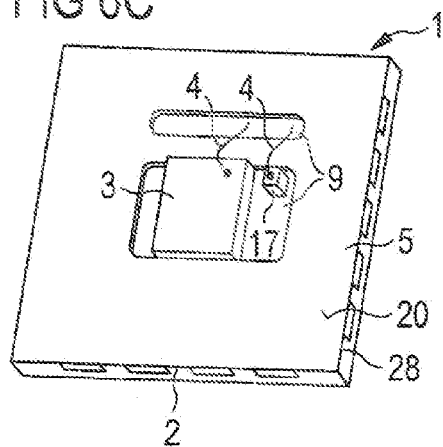
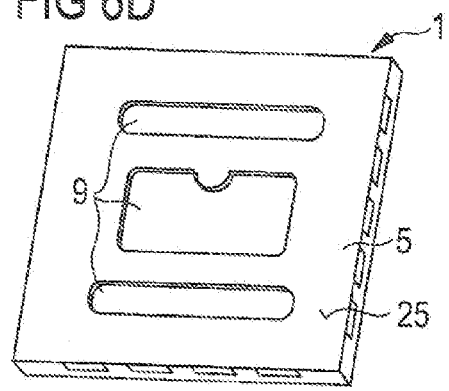
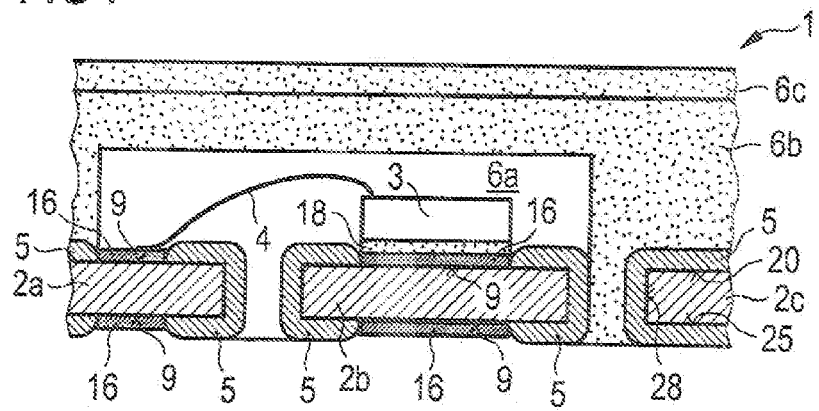

SEMICONDUCTOR ARRANGEMENT WITH A SOLDER RESIST LAYER

CROSS-REFERENCE TO RELATED APPLICATIONS

This is a §371 of International Application No. PCT/EP2010/051116, with an international filing date of Jan. 29, 2010 (WO 2010/091967 A1, published Aug. 19, 2010), which is based on German Patent Application No. 10 2009 008 738.9, filed Feb. 12, 2009, the subject matter of which is incorporated by reference.

TECHNICAL FIELD

This disclosure relates to a semiconductor arrangement and to a method of producing a semiconductor arrangement.

BACKGROUND

To produce semiconductor arrangements, lead frames are often used. A lead frame consists of a sheet metal semi-finished product, in which individual, separate lead portions are partially prefabricated by stamping or etching, these being connected at least in part to an outer region of the lead frame. The term lead frame is therefore used because at a later point the individual lead portions will be detached from the frame by stamping, etching or sawing. Copper sheet is generally used as the material, this being provided for example with a nickel and gold layer to enable reliable solder contact.

When producing known semiconductor arrangements, at least one semiconductor chip is often connected mechanically and electrically to the electrical lead portions provided. The chip and at least part of each lead portion is then encapsulated with an encapsulant. The electrical lead portions then project at least partially out of the encapsulant, to arrange them on a circuit board or some other type of contact arrangement. As a rule, such an arrangement is brought about using a soldering process. Since the encapsulant often lies with only slight adhesion on the surface of the lead portions, gaps arise, through which flux and solder penetrate into the semiconductor arrangement by capillary forces when the semiconductor arrangement is soldered to a printed circuit board. The tin-lead solder then finds itself at the surface of the lead frame, where it may result in damage. If undesired contact arises with the bonding wire arranged inside the encapsulation, this may lead to damage through embrittlement. This risk arises in particular when silicone is used as the encapsulant.

It could thus be helpful to provide a method of producing a semiconductor arrangement and a semiconductor arrangement, wherein the possibility of penetration of tin-lead solder into the encapsulation is reliably prevented.

SUMMARY

We provide a semiconductor arrangement comprising at least one lead arrangement with a top and a bottom opposite the top; at least one solder resist layer which partially covers the top and the bottom, at least sub-zones of the top and the bottom, which are not covered by the solder resist layer, forming electrical base members; an optoelectronic semiconductor element, which is mounted on at least one of the base members on the top of the lead arrangement and is connected electrically conductively therewith, and an encapsulant applied at least to the top of the lead arrangement, the encapsulant covering up the semiconductor element and lying at least partially against the solder resist layer, wherein the base members are bordered all round by the solder resist layer.

We further provide a method of producing a semiconductor arrangement comprising providing a lead arrangement with a top and a bottom opposite thereto, at least partially applying at least one solder resist layer to the top and the bottom of the lead arrangement, at least sub-zones of the top and the bottom, which are not covered by the solder resist layer, forming electrical base members, arranging an optoelectronic semiconductor element on one of the base members on the top of the lead arrangement such that the element is connected electrically conductively to the lead arrangement, and encapsulating the semiconductor component in such a way on the lead arrangement with an encapsulant that the encapsulant is at least partially in mechanical contact with the solder resist layer, wherein the base members are bordered all around by the solder resist layer.

BRIEF DESCRIPTION OF THE DRAWINGS

FIGS. 1, 2 and 4 to 7 are schematic representations of examples of semiconductor arrangements described herein.

DETAILED DESCRIPTION

Figure 1:
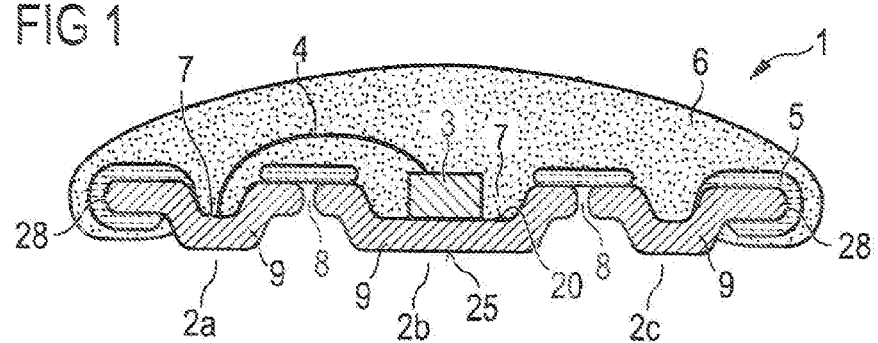

By providing a solder resist layer on the lead arrangement, on which at least one semiconductor element is mounted and connected electrically conductively and an encapsulant covers the semiconductor element in such a way as to lie at least in part against the solder resist layer, tin-lead solder is prevented from entering the region in which the encapsulant lies against the solder resist layer, since it is held back by the solder resist layer.

Providing a well in the lead arrangement makes it possible to produce a flat, tightly encapsulated semiconductor arrangement.

If a solder resist lacquer is provided as the solder resist layer, stronger adhesion is achieved between the encapsulant and the lead arrangement. This is explained below by way of examples with reference to the drawings.

The lead arrangement may comprise mutually opposing tops and bottoms. The top and bottom are covered in each case in places with the solder resist layer. The solder resist layer thus extends over both major sides of the lead arrangement. The one or more semiconductor elements are preferably mounted solely on the top.

The lead arrangement may be of multipart construction. For example, the lead arrangement comprises at least two separate portions, which are not connected by a continuous lead arrangement material. The portions are connected mechanically for example by way of an in particular radiation-transmissive encapsulant, which covers the semiconductor element and at least part of the lead arrangement. The portions of the lead arrangement are preferably insulated electrically from one another, apart from an electrical connection via the semiconductor element itself.

The solder resist layer may be a single, continuously connected-together layer, in particular relative to each of the portions of the lead arrangement.

The lead arrangement may comprise base members. The base members are provided for mounting and electrical contacting of the semiconductor element and for external electrical and/or mechanical contacting of the semiconductor arrangement. The base members for external contacting and the base members for contacting the semiconductor element are preferably located on mutually opposing sides of the lead arrangement.

At least one of the base members, preferably all of the base members, may be bordered all round by the solder resist layer. In other words a continuous path of a material of the solder resist layer exists on a surface of the lead arrangement in particular around each of the base members. The continuous path or border may be located wholly on one of the major sides of the lead arrangement. It is also possible for the continuous path to extend around the base members or one of the base members both onto the top and bottom of the lead arrangement, the land thus also being able to extend as far as an end face.

The base members on the bottom of the lead arrangement may not be covered with the encapsulant. In other words, the material of which the base members are formed is not in physical contact with the encapsulant. Preferably, no encapsulant material is arranged downstream of the base members on the bottom, in a direction perpendicular to the base members. The base members on the top may on the other hand be completely covered by the encapsulant.

The solder resist layer may extend beyond end faces of the lead arrangement, the solder resist layer, when viewed in cross-section, being of U-shaped construction in places. End faces are those surfaces of the lead arrangement which join the top to the bottom. In other words the end faces are partially or completely covered with the solder resist layer or coated therewith.

A method of producing a semiconductor arrangement is additionally provided. The method is used in particular to produce a semiconductor arrangement as indicated in relation to one or more of the stated examples. Features of the method are therefore also disclosed for the semiconductor arrangement and vice versa.

The connection zones may be provided with at least one metallic layer. The layer is preferably applied after application of the solder resist layer. When applying the metallic layer the solder resist layer may serve as a mask. In particular, the solder resist layer is applied so as to be electrically insulating and the metallic layer is electrodeposited, for example, the solder resist layer remaining uncoated during application of the metallic layer.

The solder resist layer may be applied in a patterned manner to the lead arrangement and then cured and/or dried. The solder resist layer is applied for example by spraying, printing, screen printing, curtain coating or by roller application.

The solder resist layer may remain complete on the lead arrangement after curing and/or drying. Remaining complete on the lead arrangement does not rule out the possibility of parts of the solder resist layer being removed which are located over regions of the lead arrangement which are likewise removed, for example during the process of detaching the lead arrangement from a lead frame or from a lead frame assembly, for instance by sawing.

Identical, similar or identically acting elements are provided with the same reference numerals in the Figures. The Figures and the size ratios of the elements illustrated in the Figures relative to one another are not to be regarded as being to scale. Rather, individual elements may be illustrated on an exaggeratedly large scale for greater ease of depiction and/or better comprehension.

FIG. 1 shows a semiconductor arrangement 1 in cross-section. A lead arrangement 2 consists of the three lead portions 2a, 2b and 2c. The individual portions 2a, 2b, 2c are separated by slits 8. A semiconductor element 3, for example a light-emitting diode, also known as an LED, is mounted and connected electrically conductively to the lead portion 2b in a connection zone 9 on the top 20 of the lead arrangement 2, for example by soldering. The light-emitting diode 3 is connected electrically conductively to the lead portion 2a by a bonding wire 4. The lead portions 2b, 2c may be constructed in one piece.

Furthermore, a solder resist 5 is applied in the form of a solder resist layer to the lead arrangement 2 and an encapsulant 6 encapsulates the diode 3 including the bond connection of the bonding wire 4, the encapsulant 6 being applied such that it lies on the solder resist lacquer 5 at the edge of the semiconductor arrangement 1. This makes it possible to increase the retention force of the encapsulant 6.

So that the lead arrangement 2 can be well soldered to circuit board contacts, which are not shown here, the copper sheet used as the starting material for the lead arrangement 2 is in particular coated successively with nickel, palladium and gold. Punctiform coating with silver, or "Ag spot plating", is likewise possible.

In particular when a light-emitting diode is used as the semiconductor element 3, requiring transparent, clear encapsulation, a silicone, an epoxide or a silicone/epoxide hybrid material is used as the encapsulant 6. So that this encapsulant 6 is retained better on the lead arrangement 2, the encapsulation, as illustrated in FIG. 1, is passed around end faces 28 of the lead arrangement 2 from the top 20 to the bottom 25 of the lead arrangement 2 opposite the semiconductor element 3, like the solder resist layer 5. The slits 8 are however covered completely by the solder resist layer 5, such that no encapsulant material 6 penetrates into the slits 8.

Since, as is shown in FIG. 1, the solder resist layer 5 is also applied to the bottom 25 of the lead arrangement 2 remote from the semiconductor element 3, sufficient adhesion to the encapsulant 6 is provided such that at the edge of the encapsulant 6 no opening forms between the encapsulant 6 and the lead arrangement 2 and/or the solder resist layer 5. The strength, calculated per unit area, with which the encapsulant 6 adheres to the solder resist layer 5 exceeds the strength with which the encapsulant 6 adheres directly to the lead arrangement 2 preferably by at least a factor of 1.5, in particular by at least a factor of 2.

So that the lead arrangement 2 encapsulated as in FIG. 1 may be soldered to circuit board terminals, the lead arrangement 3, in a direction perpendicular to a main direction of extension of the lead arrangement 3, comprises base members 9 on the bottom 25 projecting beyond the encapsulant 6. These base members 9 are produced by cold forming, whereby the base members 9 are produced opposite wells 7 on the top 20 of the lead arrangement 2. This structuring may however also proceed by etching. In contrast to what is shown in FIG. 1, it is also possible for the encapsulant 6 and the base members 9 to terminate level or flush with one another in the direction perpendicular to the main direction of extension of the lead arrangement 3 and/or in the lateral direction.

Figure 2:
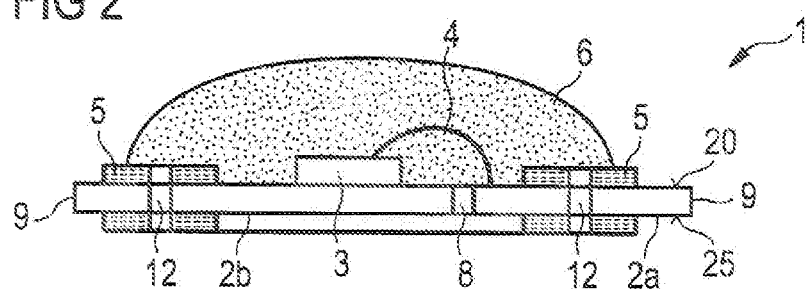

FIG. 2 shows a further example, in which the semiconductor arrangement 1 comprises a plane lead arrangement 2. In this example the encapsulant 6 is applied only to one side, such that only part of the top 20 is covered by the encapsulant 6 and such that the bottom 25 is free or substantially free of the encapsulant 6. For example less than 25% or less than 10% of the bottom 25 is covered by the encapsulant 6 and/or the solder resist layer 5.

Parts of the lead arrangement 2 project laterally beyond the encapsulant 6 at one edge of the lead arrangement 2 to form the base members 9. In the example shown, the encapsulant 6 penetrates into openings 12 so that the encapsulant 6 is anchored to the lead arrangement 2. It is possible for the encapsulant 6 to penetrate completely into the slit 8 and/or the openings 12, which are respectively formed in the lead portions 2a, 2b, and to cover part of the bottom 25.

Figure 3:
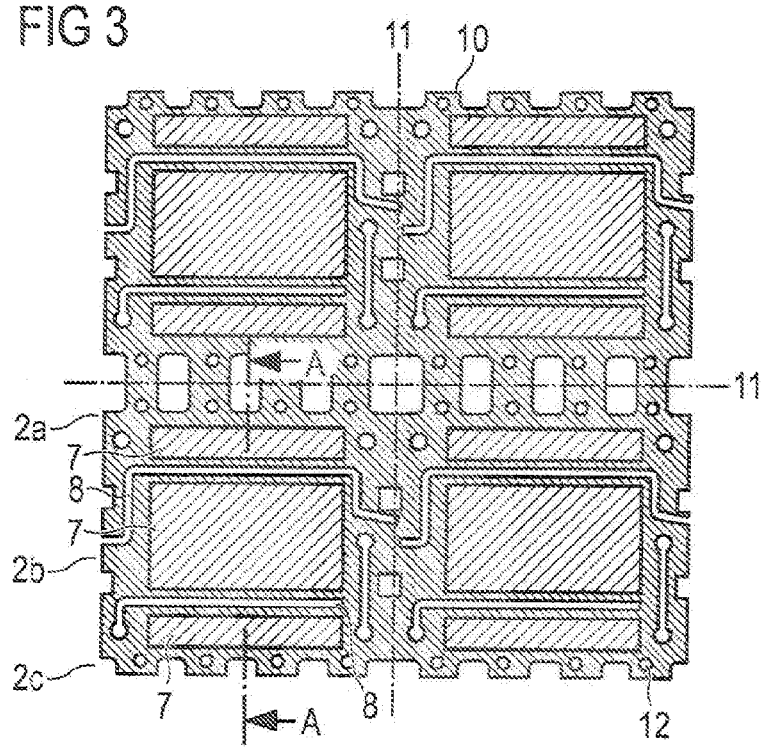
FIGS. 3 and 8 show a lead frame.

FIG. 3 shows a lead frame assembly 10, the lead arrangement 2 being detached therefrom for example by stamping or by sawing along dividing lines 11. The cross-sectional arrangement shown in FIG. 1 arises along section line A/A, wherein in FIG. 3 only the lead frame assembly 10 is illustrated, without semiconductor components and without encapsulant. Following the dividing lines 11 makes it clear that the lead portions 2a and 2b are isolated from one another by the slit 8 for instance by stamping out along the dividing lines 11. However, this separation does not affect the regions 2c and 2b, which remain joined together by way of individual portions.

An example of a method of producing the semiconductor arrangement 1 illustrated in FIGS. 1 and 2 will now be described. A lead frame 2 is provided, as illustrated in the view according to FIG. 3. First, the slits 8 and openings 12 are stamped or etched out of a sheet metal material. The sheet metal material comprises or consists of copper and is preferably coated with nickel, palladium and gold. This coating may take place before or after shaping of the lead frame assembly 10. Furthermore, regions 7 and 9 are formed according to FIG. 1 either by cold forming or by etching.

Then a solder resist lacquer is applied in the shaded region, so resulting in the solder resist layer 5. Alternatively, the solder resist layer 5 may also be provided before coating of the lead frame assembly 10. A material of the solder resist layer 5 is then in direct contact with a material of the lead frame assembly 10, for example copper. Adhesion of the solder resist layer 5 to copper is greater than to the coating, in particular than to gold. If in particular the lead frame assembly 10 comprises undercuts, the solder resist layer 5 is applied from both sides of the lead frame assembly 10, for example by a double-sided screen printing process.

The semiconductor element 3 is then mounted in the well 7 in the lead portion 2b and connected electrically conductively to the portion 2b. Then a bond connection is formed by the bonding wire 4 between the semiconductor element 3 and the well 7 in the lead portion 2a. Finally the encapsulant 6 is applied. If the semiconductor arrangement 1 is then separated out of the lead frame assembly 10 shown in FIG. 3 along the dividing lines 11 by dividing, sawing, etching or cutting, the lead portions 2a and 2c do not fall apart, since they are held together by the encapsulant 6.

If the semiconductor arrangement 1 shown in FIG. 1 is then placed with the base members 9 on a circuit board, not shown, and soldered in place, the solder resist lacquer 5 prevents the tin-lead solder from penetrating under the encapsulant, in particular between the encapsulant 6 and the lead frame 2. Such penetration may be reinforced by capillary forces in the absence of any solder resist layer 5.

A further advantageous result of using the solder resist lacquer is that selection of a specific color for the solder resist lacquer also determines the coloring of the semiconductor arrangement 1 when the encapsulant 6 is clear and transparent. For example, a black solder resist layer 5 may increase the contrast of the radiation emitted by the semiconductor arrangement 1. A white solder resist layer 5 may increase the efficiency with which radiation is coupled out of the encapsulant 6. The solder resist layer 5 may also be transparent or capable of diffuse scattering.

Figure 4:
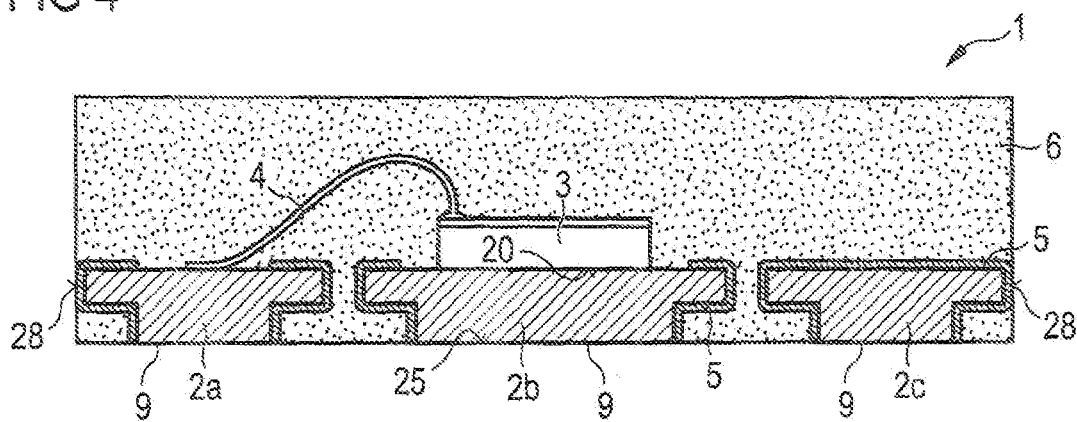

The arrangement shown in FIG. 4 is a further configuration of the example according to FIG. 2. Here too, the semiconductor element 3 is arranged on a lead portion 2b and is connected electrically conductively to the lead portion 2a via the bonding wire 4. Together with the portion 2c, the three portions, which together form the lead arrangement 2, are surrounded almost completely by the encapsulant 6. Only the base members 9 are free, as shown in FIG. 4. The end faces 28, which define the lead arrangement 2 laterally, may optionally also be free of encapsulant 6, for example as the result of a detachment process.

Here too, the solder resist layer 5 is preferably applied to all surfaces of the lead arrangement 2 which are not needed for contacting of the semiconductor element 3 or for external contacting, the solder resist layer ensuring good adhesion of the encapsulant 6 to the lead arrangement 2 and preventing the penetration of soldering flux between the encapsulant 6 and the lead arrangement 2. The laterally outer end faces 28 may optionally not be covered by the solder resist layer 5, unlike what is shown in FIG. 4.

Figure 5:
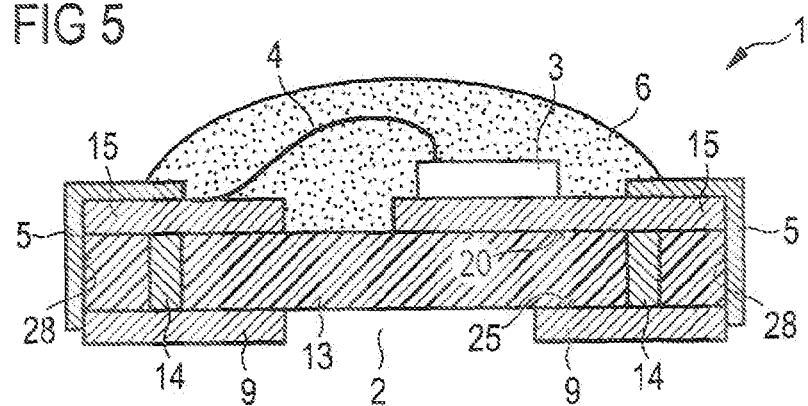

FIG. 5 shows a further example. In this example the lead arrangement 2 comprises a carrier 13 and base members 9 and 15 on both sides. The inner base members 15 provide the contact pad for the semiconductor element 3, an LED here too for example, and the bond pad to which the bonding wire 4 coming from the semiconductor element 3 is attached. The inner base members 15 are connected electrically conductively to the base members 9 by vias 14.

It could basically be assumed that the carrier 13, which consists in this example of a plastics material, prevents the solder material from creeping up the end faces 28 on soldering on of the base members 9. During detachment, however, the above-described lead arrangement 2 according to this example is sawed. On sawing, it may happen that conductive material of the base members 9 and/or 15 reaches the end faces 28, which in turn entails the risk of solder material reaching the encapsulant 6. In this example too, it is therefore advantageous for a solder resist layer, as shown, to be applied in particular over the end faces 28 of the lead arrangement. Furthermore, in this example the solder resist layer 5 also ensures better retention of the encapsulant 6 on the inner base members 15.

This example is produced in a similar manner to the production method as described with reference to the example according to FIG. 1.

FIG. 6C shows a schematic view from above and FIG. 6D a schematic view from below, the views in each case being perspective views, of a further example of the semiconductor arrangement. FIGS. 6A and 6B show perspective views respectively from above and below of the underlying lead frame or the underlying lead frame assembly 10.

In FIG. 6, the individual lead portions of the lead arrangement 2 are not shown, and nor is the encapsulant. On the top 20 of each of the lead arrangements 2 there are located two of the base members 9, while in each case three of the base members 9 are located on the bottom 25. Each of the base members 9 is bordered all around by the solder resist layer 5. On the top 20 on the common first land 9, there are mounted both the semiconductor element 3 and a protective component 17 providing protection against damage due to electrostatic charges. The protective component 17 may likewise be a light-emitting diode.

With the second land 9 on the top 20 an electrical connection is produced via the bonding wires 4 to the semiconductor element 3 or to the protective component 17. The bonding wires 4 are attached for example using a friction welding process. By surrounding the base members 9 with the solder resist layer 5, the bonding wires 4 are permanently protected from physical contact with a tin-lead solder, not shown, with which the semiconductor arrangement 1 is attached via the bottom 25 for instance to a printed circuit board, not shown. This also prevents embrittlement or breakage of the bonding wires 4.

In the further example of the semiconductor arrangement 1, as seen in the sectional representation in FIG. 7, the lead portions 2b, 2c are connected mechanically to the lead portion 2a via multiple layers of the encapsulants 6a, 6b, 6c. The encapsulants 6a, 6b, 6c are based on or contain for example a silicone and in particular one or more admixtures in the form of diffusion media, conversion media for wavelength conversion, filter media, agents for increasing thermal conductivity or adjusting a coefficient of thermal expansion and/or curing agents. For example a conversion medium is admixed with the encapsulant 6a directly surrounding and enclosing the semiconductor element 3, an agent for absorbing or reflecting ultraviolet radiation is admixed with the continuous encapsulant 6b and a curing agent for increasing scratch resistance, for instance, is admixed with the laminar encapsulant 6c. The encapsulants 6a, 6b, 6c may also be based on mutually different materials. The encapsulant 6a is limited laterally substantially to the base members 9, while the encapsulants 6b, 6c cover the entire top 20.

Figure 8A:
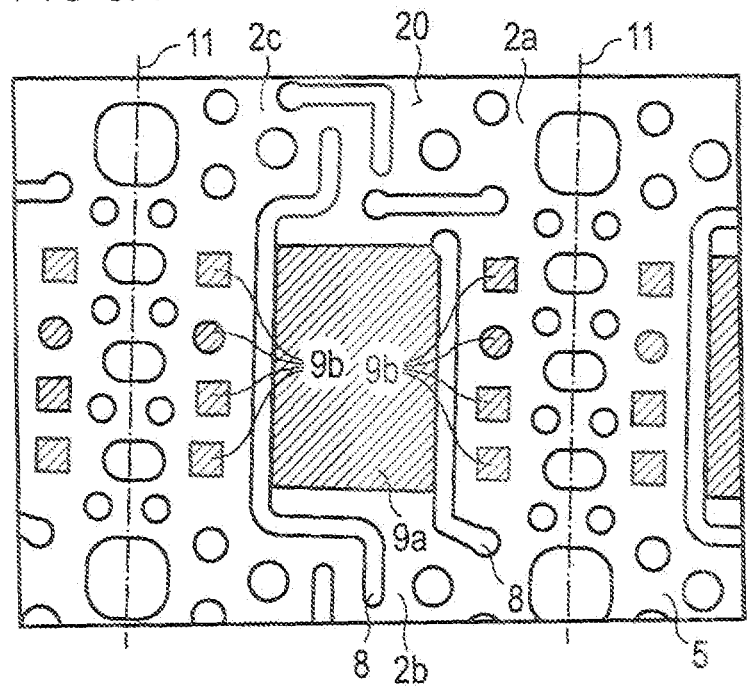
Figure 8B:
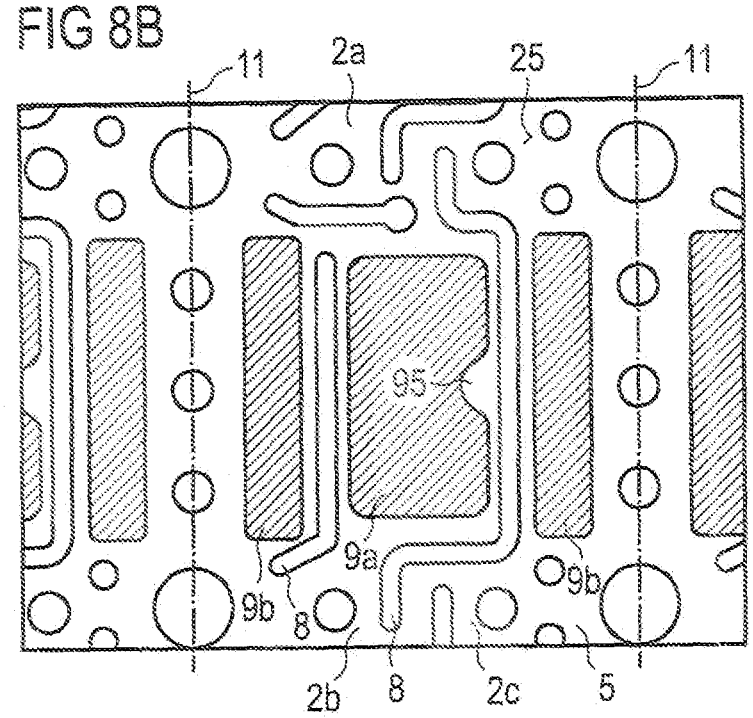

FIG. 8A shows a plan view and FIG. 8B a view from below of a further example of a lead frame. On the top 20 a plurality of base members 9b are formed, wherein in each case several of the base members 9b on the top 20 are brought together into a single, corresponding land 9b on the bottom 25. In order in particular to mark the direction of mounting on for example a printed circuit board not shown here, the land 9a on the bottom 25 comprises a for example colored marking in the form of an indentation 95 formed in the land 9a by the solder resist layer 5, see also FIG. 6D. The dividing lines 11 pass in each case through a plurality of holes or openings through the lead frame.

The description made with reference to examples does not restrict our chips and methods to these examples. Rather, this disclosure encompasses any novel feature and any combination of features, including in particular any combination of features in the appended claims, even if the feature or combination is not itself explicitly indicated in the claims or examples.

The invention claimed is:

1. A semiconductor arrangement comprising:
    a lead frame with at least two separate pieces, each with a top and a bottom opposite the top, wherein the lead frame is made from a sheet metal semi-finished product and the at least two pieces are not connected by a continuous lead frame material;
    at least one solder resist layer which partially covers the tops and the bottoms and that is of U-shaped cross section at least in selected locations, such that the solder resist layer extends beyond end faces of the lead frame and reaches as a continuous layer from the top to the bottom, wherein the selected locations of the U-shaped cross section of the solder resist layer are locations where the end faces of the two separate pieces of the lead frame are adjacent to one another, and wherein at least portions of sub-zones of the tops and the bottoms, which are not covered by the solder resist layer, form electrical base members;
    an optoelectronic semiconductor element, which is mounted on at least one of the base members on the top and is connected electrically conductively therewith, and
    a radiation-transmissive encapsulant applied at least to the tops of the pieces, the encapsulant covering up the semiconductor element and lying at least partially against the solder resist layer,
    wherein the base members are bordered all round by the solder resist layer when viewed from a top view of the top or the bottom, the semiconductor element is mounted on exactly one of the pieces of the lead frame and connected electrically conductively via an electrically conductive connecting element to at least one other of the pieces and the pieces are connected mechanically by the encapsulant.

2. The semiconductor arrangement according to claim 1, wherein the lead arrangement comprises at least one well in which the semiconductor element is secured.

3. The semiconductor arrangement according to claim 1, wherein the base members of the bottom are not covered by the encapsulant.

4. The semiconductor arrangement according to claim 1, wherein the at least two pieces are separated from one another by a slit.

5. The semiconductor arrangement according to claim 1, wherein the solder resist layer consists of a solder resist lacquer.

6. The semiconductor arrangement according to claim 1, comprising at least two of the base members both on the top and on the bottom.

7. The semiconductor arrangement according to claim 1, in which the connecting element is a bonding wire.

8. The semiconductor arrangement according to claim 1, wherein the at least one semiconductor element is a light-emitting diode, a laser diode or a photodiode.

9. The semiconductor arrangement according to claim 1, wherein a continuous path of a material of the solder resist layer exists on a surface of the lead arrangement around each of the base members and the continuous path is located wholly either on the top or on the bottom.

10. The semiconductor arrangement according to claim 1, wherein the lead frame consists of copper.

11. The semiconductor arrangement according to claim 10, wherein the lead frame is coated with nickel, palladium and gold.

12. The semiconductor arrangement according to claim 1, wherein each sub-zone of the tops and the bottoms which are not covered by the solder resist layer, consists of an electrical base member; and
    the electrically conductive connection element is a bonding wire.

13. The semiconductor arrangement according to claim 5, wherein the encapsulant comprises a transparent and clear silicone, epoxide or silicone/epoxide hybrid material and the lead frame is formed from cooper, copper coated with nickel, palladium and gold, or copper coated with silver, and wherein outermost ends of the lead frame are not covered with the solder resist layer.

* * * * *